United States Patent [19]
Goukassian

[11] Patent Number: 6,015,588
[45] Date of Patent: Jan. 18, 2000

[54] METHOD FOR FABRICATING ELECTRON MULTIPLIERS

[75] Inventor: Samuel Goukassian, Livonia, Mich.

[73] Assignee: Electron R+D International, Inc., Farmington, Mich.

[21] Appl. No.: 08/713,774

[22] Filed: Sep. 13, 1996

Related U.S. Application Data

[60] Division of application No. 08/440,754, May 15, 1995, Pat. No. 5,624,706, which is a continuation-in-part of application No. 08/321,042, Oct. 5, 1994, abandoned, which is a continuation of application No. 08/092,083, Jul. 15, 1993.

[51] Int. Cl.[7] ................................................ B05D 5/12
[52] U.S. Cl. .......................... 427/77; 427/78; 427/126.1; 427/231; 427/237; 427/238; 427/255.5; 427/294; 427/209; 313/103; 313/104; 313/359.1; 313/387; 313/386; 313/399; 313/402; 313/523; 313/103 CM; 313/105 CM; 313/105 R
[58] Field of Search ........................... 427/77, 78, 126.1, 427/231, 237, 238, 255.5, 294, 209; 313/103, 104, 359.1, 387, 386, 399, 402, 523, 103 CM, 105 CM, 105 R

[56] References Cited

U.S. PATENT DOCUMENTS

| | | | |
|---|---|---|---|
| 3,739,216 | 6/1973 | Pakswer | 313/95 |
| 3,757,351 | 9/1973 | Simms | 346/74 |
| 3,979,621 | 9/1976 | Yates . | |
| 3,979,637 | 9/1976 | Siegmund . | |
| 4,005,323 | 1/1977 | Yates et al. . | |
| 4,010,019 | 3/1977 | Cole et al. . | |
| 4,039,887 | 8/1977 | McDonie . | |
| 4,088,510 | 5/1978 | Dresner et al. | 148/6.3 |
| 4,099,079 | 7/1978 | Knapp . | |
| 4,153,855 | 5/1979 | Feingold . | |
| 4,365,150 | 12/1982 | Bateman . | |
| 4,395,437 | 7/1983 | Knapp . | |
| 4,639,638 | 1/1987 | Purcell et al. . | |
| 4,777,403 | 10/1988 | Stephenson . | |
| 4,945,286 | 7/1990 | Phillips et al. | 313/105 |
| 4,976,988 | 12/1990 | Honda . | |
| 4,980,604 | 12/1990 | L'Hermite . | |
| 5,086,248 | 2/1992 | Horton et al. . | |
| 5,265,327 | 11/1993 | Faris et al. | 29/825 |
| 5,367,218 | 11/1994 | Comby | 313/105 |

FOREIGN PATENT DOCUMENTS

| | | |
|---|---|---|
| 0 353 632 A2 | 2/1990 | European Pat. Off. . |
| 795206 | 4/1979 | U.S.S.R. . |
| 824808 | 12/1979 | U.S.S.R. . |
| 1023446 | 5/1981 | U.S.S.R. . |
| 912417 | 12/1962 | United Kingdom . |
| 1295832 | 11/1972 | United Kingdom . |

OTHER PUBLICATIONS

Wiza, Joseph Ladislas, "Microchannel Plate Detectors", *Nuclear Instruments and Methods* 162 (1979) 587–601.
Joseph Ladislas Wiza Nuclear Instruments and Methods 162:587–601, 1979.

Primary Examiner—Chris Eisenschenk
Assistant Examiner—Mary K. Zeman
Attorney, Agent, or Firm—Brooks & Kushman P.C.

[57] ABSTRACT

A method for fabricating an electron multiplier is provided. The method consists of depositing a random channel layer on a substrate such that the random channel layer is capable of producing a cascade secondary electron emission in response to an incident electron in the presence of an electric field.

15 Claims, 3 Drawing Sheets

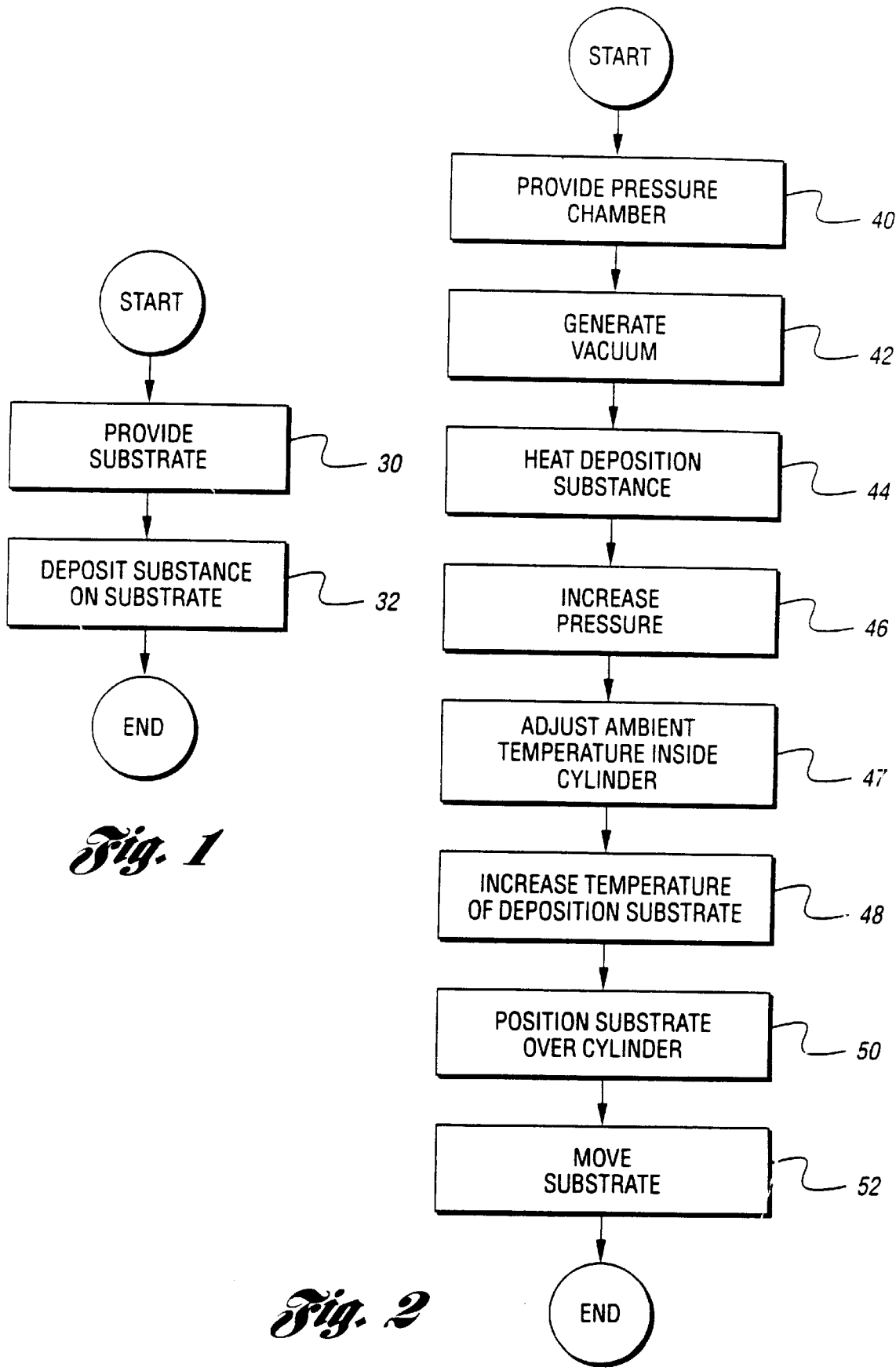

METHOD FOR FABRICATING ELECTRON MULTIPLIERS

CROSS-REFERENCE TO RELATED APPLICATIONS

This is a divisional of application Ser. No. 08/440,754 filed on May 15, 1995 now U.S. Pat. No. 5,624,706, which is a continuation-in-part application of Ser. No. 08/321,042 filed Oct. 5, 1994, now abandoned, which was a continuation of Ser. No. 08/092,083 filed Jul. 15, 1993.

TECHNICAL FIELD

The present invention relates to methods for fabricating electron multiplier devices, and to electron multiplier devices prepared thereby.

BACKGROUND ART

Microchannel plate electron multipliers (MCPs) are continuous dynodes generally consisting of glass with a high lead oxide content, made slightly conductive through a hydrogen firing process. The glass tubes forming the microchannels have electrodes at the entrance and exit. The entrance can be conical or straight, while the main section is straight, bent, or spiraled. The output current has to be a tenth or less of the strip current, otherwise the multiplier operates in a saturated mode. The amplification depends on the length-to-diameter ratio of the multiplier, the axial field strength, and the secondary-electron-emitter material.

Fabrication of microchannel plate electron multipliers and their characteristics is described by J. L. Wiza, "Microchannel Plate Detectors", NUCLEAR INSTRUMENTS AND METHODS, 162 (1979), pp. 587–601. Glass rods having a core of etchable glass and cladding of non-etchable lead glass are stacked into hexagonal arrays and drawn down to smaller size. The resulting arrays are again stacked into hexagonal arrays and redrawn to finer size, following which they are stacked and fused within a glass envelope to form a boule. The boule may be sliced orthogonally or at an angle to the boule axis, the surface of the resulting plates polished, and the core glass etched away, leaving an array of closely spaced, hollow, cylindrical microchannels in a regular geometric pattern. The plates are subjected to hydrogen reduction at elevated temperature, forming a layer of semiconductive lead on the tube interior surfaces. The front and back of the plates are then metallized to form conductive electrode surfaces.

The microchannel plates thus produced may be used singly or stacked to form multiple layer arrays. The cost of such devices is high, due to the multiple drawing and other steps required, and the useful gain limited by ion feedback and dark noise. Ion feedback is greatly increased at operating pressures above $10^{-6}$ torr, and thus operation generally requires a relatively high vacuum, $10^{-5}$ torr, and preferably $10^{-6}$ torr or below. Size is limited both by the nature of the manufacturing process as well as the necessity of providing a supporting envelope capable of withstanding the requisite internal/external pressure differential.

Thus, although such MCPs exhibit numerous advantages, they also exhibit the following problems:

a) They utilize highly complicated technology;
b) They are relatively costly to produce;
c) The sensor area is limited to approximately 125 mm$^2$;
d) Their effective surface (permeability or open area) is typically on the order of only 50%–60%;
e) They have a relatively high dark noise (0.5 s$^{-1}$cm$^{-2}$);
f) They can only be economically produced in a flat configuration;
g) They are made of material restricted to one type;
h) They function only in high vacuum.

All of the above constraints prevent MCPs from being used more widely, particularly in areas of medical and industrial diagnostics, flat screens, nuclear science and others.

Improvements in microchannel plate devices have centered on making them more economical to produce, or maximizing their operating parameters, for example by increasing collection efficiency, decreasing ion feedback, or increasing secondary electron emission, thus increasing gain. However, little attention has been devoted to altering the basic means of manufacture.

In Knapp, U.S. Pat. No. 4,395,437, for example, dynodes are prepared from mild steel perforated with numerous holes in a regular geometric array to form microchannels rather than use multiple glass drawings to prepare the microchannel plate. Layers of magnesium and aluminum are then formed on the dynode by evaporation of the metals at a pressure of 1 to 3×10$^{-5}$ torr. The coating is then allowed to oxidize in ambient air and activated by heating for several hours in oxygen at pressure in the range of 10$^{-4}$ to 10$^{-5}$ torr. The microchannel plates are then stacked with insulating spacers to form a multiple layer, microchannel device. No indication of gain is given, but secondary electron emissions on the order of 8 are achieved. A similar concept, using a metal/ceramic (cermet) coating is disclosed by Knapp in U.S. Pat. No. 4,099,079.

Pakswer, in U.S. Pat. No. 3,739,216, discloses both conventional high vacuum electrostatic electron multiplier tubes as well as microchannel multiplier plates where improved secondary emission at low cross-over voltage is achieved, as in Knapp '079, by the use of a cermet coating consisting of metal globules 40–500 Å in size dispersed in a ceramic matrix, forming a single layer thin film having a thickness of from 200–2000 Å (0.02–0.2 μm). In microchannel plate devices, this film may be vacuum-sputtered or deposited by chemical vapor deposition into the tubular glass microchannels of devices such as those disclosed by Wiza. The devices suffer from the same drawbacks as those of Wiza, requiring high vacuum for operation. The metal globules lower the resistivity of the matrix.

It would be desirable to provide an electron multiplying device which is capable of more cost-effective manufacturing than microchannel plate devices currently available. It would further be desirable to provide a microchannel plate electron multiplier capable of being produced in greater variety of sizes and shapes than those presently available. It would be yet further desirable to provide a microchannel electron multiplier having high gain and low dark noise, and to provide a method for the production of such devices.

The micro random channel plate devices of the subject invention have solved many of the problems inherent in microchannel plate electron multipliers of the prior art. The subject devices provide a structure comprising randomly situated crystals, the interstices between which form randomly oriented channels for producing secondary emissions. These devices may be efficiently and inexpensively fabricated on not only flat surfaces but on surfaces of other shapes, and importantly, surfaces of widely varying size as well.

SUMMARY OF THE INVENTION

It is thus an object of the present invention to provide a method for fabricating electron multipliers which is both efficient and inexpensive.

Further, an object of the present invention is to provide a method for fabricating electron multipliers of relatively large size as a result of simple technology.

Moreover, an object of the present invention is to provide a method for fabricating electron multipliers such that the actuating surface is nearly 100% of the actual surface.

An additional object of the present invention is to provide a method of fabricating electron multipliers which result in a low dark noise.

An object of the present invention is also to provide a method for fabricating electron multipliers which allows the formation of a secondary electron emitting plate whose surface is of any arbitrary configuration.

An object of the present invention is further to provide a method for fabricating an electron multiplier such that a variety of different deposition substances may be used to achieve the necessary performance characteristics.

It is an additional object of the present invention to provide a method for fabricating an electron multiplier which is capable of forming channels which prevent the through traffic of ions.

In carrying out the above objects, the present invention provides a method for fabricating an electron multiplier. The method comprises the steps of providing a substrate, and depositing on the substrate a random channel layer of deposition substance capable of generating secondary electron emission in the presence of an electric field in response to an incident electron.

In further carrying out the above objects, the present invention provides a method for fabricating a multiplying element for an electron multiplier. The method comprises the steps of providing a pressure controllable chamber, generating a vacuum within the pressure chamber, and heating a deposition substance to a temperature below the melting point of the substance so as to dry the deposition substance. Further, the pressure in the pressure chamber is increased, and the temperature of the deposition substance is increased so as to create a transition of at least a portion of the substance to a vapor. A substrate is positioned in proximity to the deposition substance so that the deposition substance vapor is condensed upon the substrate wherein the deposition substance forms a low density random channel layer on the substrate, the layer capable of generating a secondary electron emission in the presence of an electric field in response to an incident electron.

The objects, features and advantages of the present invention are readily apparent from the following detailed description of the best mode for carrying out the invention when taken in connection with the accompanying drawings.

BRIEF DESCRIPTION OF THE DRAWINGS

FIG. 1 represents a schematic diagram of an apparatus used for implementing one embodiment of the present invention;

FIG. 2 presents a flow chart representation of one embodiment of the present invention;

BEST MODE FOR CARRYING OUT THE INVENTION

Figure 3:
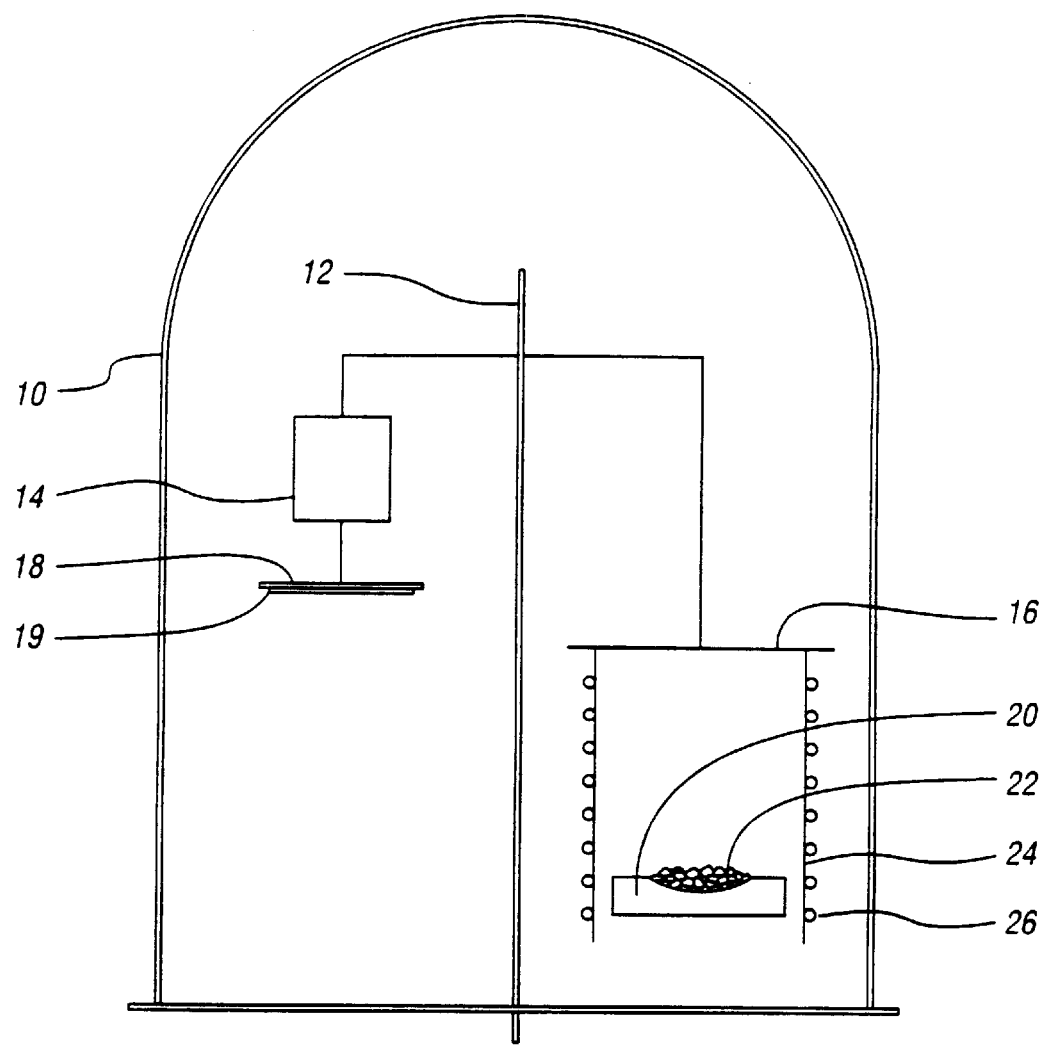
FIG. 3 presents a flow chart representation of an alternative embodiment of the present invention.

The present invention relates to micro random channel plate (MRCP) electron multipliers (EM) and their fabrication. An MRCP EM consists of two electrodes with certain distance in between, between which is a plate of performing substance, hereinafter a micro random channel plate. The micro random channel plate of the MRCP EM is fabricated by particular deposition of substances with high coefficient of Secondary Electron Emission (SEE), as more fully described hereinafter.

The structure of the plate depends upon many parameters of the deposition process. The main parameters are: The environmental content, temperature and pressure where the product is deposited; The quality, purity and temperature of product that is being deposited; the intensity of deposition; and the distance from depositor's surface to the substrate. By adjusting these parameters in selected ways, the micro random channel plate will have many channels of a particular size and with particular characteristics.

The micro random channel plates of the subject invention, unlike the microchannel plate devices of the prior art, contain randomly situated channels consisting of open space between chaotically situated dynodes which comprise crystals or aggregates of crystals of a substance having a secondary electron emission yield greater than one. While in prior art devices the microchannels are purposefully created with a given diameter and depth and positioned in a predetermined regular geometric array, in the subject devices the position and location of the channels is not predetermined nor is the diameter or depth of the channels fixed. Rather, by the process utilized to form the subject micro randomchannel plates, the crystal growth of the secondary electron-emitting substance is itself random. The result is a micro random channel plate containing a performing substance layer consisting of multitudinous discrete dynodes arranged chaotically. Between the chaotically arranged dynodes are microchannels defined by the distance between adjacent dynodes. As the dynodes are chaotically located, the channels by their nature are random in location, diameter, and length.

Thus, the method of production of the micro random channel plates of the subject invention is far different from conventional coating techniques such as RF sputtering, vacuum deposition, vapor deposition, or conventional chemical vapor deposition. In each of these traditional coating techniques, the aim is to form a uniform coating, generally one having a particular, predetermined crystalline orientation, generally a hard, smooth, thin coating. In order to do so, such coating methods are performed in relatively high vacuum, generally with the deposition source proximate to the surface to be coated. The coatings thus produced have substantially the same density as the deposition substance, with the exception of chemical vapor deposition where, due to the decomposition of the chemical precursor substance into a compound of simpler stoichiometry, the density of the coating is generally higher than the density of the decomposition substance. For example, a volatile titanium organosulfide may be chemically vapor-deposited to form a titanium disulfide coating.

In contrast, preparation of the micro random channel plate devices of the subject invention involves deposition under conditions where a smooth, high density coating is not formed. Rather, the conditions are purposefully selected such that crystal growth is random rather than consistently oriented, and of low rather than high density. One method of producing this random, or "chaotic" crystal growth, is to maintain the pressure in the deposition chamber at a much higher pressure than utilized for other coating methods, for example 1 to 10 torr rather than $10^{-2}$ to $10^{-9}$ torr, and to maintain a suitable distance of separation between the deposition substance and the substrate. Rotation of the substrate on which the deposit forms aids in both randomizing crystal growth and orientation as well as generating a uniform surface, uniform being used in the sense of having the same thickness, density, and degree of randomness in crystalline orientation.

Moreover, and again in contrast to previous coating techniques, the apparent density of the deposited performing substance layer is far less than the density of the substance deposited, for example from 0.3 to about 4 percent of the deposition substances density, preferably 0.5 to about 2 percent. For example, with cesium iodide as the secondary electron emission substance, the apparent density of the cesium iodide on the micro random channel plate device will be only about 0.6% of the density of solid cesium iodide. Thus, the coating may be likened to a coating of dry snow as compared to a solid film of ice, the snow crystals being chaotically positioned with respect to each other, and separated by distances which provide for numerous, randomly oriented channels between them.

Thus, the subject invention provides a process for the preparation of a micro random channel plate which includes providing a substrate, and providing a deposition substance or precursor thereof, the deposition substance having a coefficient of secondary electron emission greater than 1. The deposition substance is deposited onto the substrate to form a performing substance layer comprising a plurality of chaotically situated dynodes interspersed with open space constituting random microchannels. The location of the dynodes and microchannels is non-predetermined. The performing substance layer generates secondary electron emission in the presence of an electric field in response to an incident electron.

The subject invention further provides a process for the preparation of a micro random channel plate device having a performing substance layer including a plurality of chaotically situated dynodes having interspersed therebetween a plurality of random microchannels. The micro random channel plate device generates a secondary electron emission in the presence of an electric field in response to an incident electron. The process includes providing a substrate and providing a deposition substance, or precursor thereof, which has a coefficient of secondary electron emission greater than 1. The deposition substance is heated to a temperature below its melt temperature at a first pressure less than atmospheric to dry the deposition substance, following which the temperature of the deposition substance is increased to a temperature at least equal to its melt temperature at a second pressure in the range of 1 to 10 torr, which melts the deposition substance. The substrate is positioned relative to the molten deposition substance such that the deposition substance condenses onto the substrate to form the performing substance layer.

In order to produce an electron multiplying effect, the average number of secondary electrons emitted must exceed the number of incident electrons. Virtually any secondary electron emissive substance meeting this requirement may be utilized, provided that it may be deposited in the form hereinbefore described, i.e., as chaotically oriented dynodes having between them random microchannels of the proper dimensions. Examples of suitable substances, for example, are alkali halides such as the fluorides, chlorides, bromides, and iodides of lithium, sodium, potassium, rubidum, or cesium; the alkaline earth metal halides such as the fluorides, chlorides, bromides or iodides of beryllium, magnesium, barium, or strontium; metal oxides such as those of aluminum, magnesium, beryllium, calcium, barium, and silicon; sulfides such as lead sulfide and zinc sulfide, and the like. Also suitable are sodium aluminum fluoride, and other bimetallic halides and oxides. Metals may also be used, however the secondary electron emission yield is less than with the substances heretofore mentioned. Those familiar with the secondary electron emission properties of substances can readily augment this list.

The MRCPs of the subject invention can be fabricated on practically any surface. The surface may be of almost unlimited size and need not be flat. The fabrication process is inexpensive and adaptable to various configurations such as thin wire, tiny matrix, etc. known to those familiar with micro channel plate electron multipliers. The MRCP electron multiplier performs in low as well as high vacuum with performing parameters equal to, or better than those of micro channel plate devices.

Turning now to FIG. 1, a flow chart representation of one embodiment of the method for fabricating the electron multiplier plate of the present invention is presented. The method begins by providing a substrate as shown in block 30. A random channel layer of performing substance is deposited on the substrate as shown in block 32. This performing substance is capable of generating a cascade secondary electron emission in the presence of an electric field in response to an incident electron. A crystalline layer may be formed from the condensation of the deposition substance in a vaporous state such that the crystals are oriented randomly with respect to the substrate. Similarly, other methods of deposition may be used such as chemical processes capable of forming the random channel structure.

The substrate mentioned above may consist of an anode or a cathode used for supplying an electric potential to the plate. Alternatively, the substrate may provide a support substance for the deposition process which is in turn removed from the performing substance by some manner, such as etching, after the deposition has been performed.

FIG. 2 presents a flow chart representation of an alternative method for fabricating an electron multiplier of the present invention. The method begins by providing a pressure chamber as shown in block 40. A vacuum is generated within the pressure chamber as shown in block 42. A deposition substance within the chamber is heated to a temperature below the melting point of the substance so as to dry the deposition substance as shown in block 44. The pressure within the pressure chamber is then increased as shown in block 46. The ambient temperature inside the cylinder enclosing the deposition substance is adjusted as shown in Block 47. The temperature of the deposition substance is increased so as to create a transition of at least a portion of the deposition substance to a vapor as shown in block 48. A substrate is positioned over the cylinder in proximity to the deposition substance so that deposition substance vapor is condensed upon the substrate as shown in block 50. The plate is moved so as to promote an even distribution of condensed deposition material as shown in block 52, wherein the deposition substance forms a random channel layer on the substrate with the crystals of the porous layer oriented randomly with respect to the substrate, and wherein the layer is capable of generating a secondary electron emission in the presence of an electric field in response to an incident electron.

In the preferred embodiment, the substrate is rotated approximately 200 times during the deposition of the crystalline layer. Thus, for a deposition time of ten minutes, the substrate is rotated at an angular velocity of 20 revolutions per minute, and for a deposition time of one minute, the substrate is rotated at an angular velocity of 200 revolutions per minute. The rate of rotation may easily be adjusted to maximize performance parameters.

FIG. 3 presents a schematic representation of an apparatus for making the EM plate of MRCP. Situated in a bell jar or similar pressure chamber 10 are: manipulator 12, electric motor 14, screen 16, substrate 18, random channel plate 19, resistive evaporator 20, deposition substance 22, fencing cylinder 24 and temperature regulator 26.

The fabrication process starts by creating a vacuum of approximately $10^{-2}$ torr under the bell jar 10. The top end of the cylinder 24 is closed by the screen (shutter) 16. The evaporator 20 is turned on and its temperature is kept below the melting point of the deposition substance 22 until it is dry. Then the pressure under the jar is brought up to 1–10 torr, determined experimentally depending on the particular deposition substance 22 being used. A particular pressure is suitable if the process yields an electron multiplier with a suitable gain. Temperature of the evaporator 20 is raised slightly above the melting point of the substance 22. Simultaneously the necessary ambient temperature is created in the cylinder 24 by temperature regulator 26, to create micro crystals of the necessary size. At that point the screen 16 is moved aside, the substrate is situated above the cylinder 24. The motor 14 is turned on, and the substrate 18 is rotated to create even plate 19 of performing substance 22 on the substrate.

After the plate 19 has reached the necessary thickness, the substrate 18 and plate 19 are moved aside and the plate is ready. The pressure under the bell jar is brought up to ambient, the electron multiplier plate is removed from the bell jar. As previously mentioned, the substrate 18 may be an anode or cathode used for supplying an electric potential to the plate. The is second electrode is situated over the plate in a manner that it is barely touching the plate, or in other orientations as will be apparent to those skilled in the art of electron multipliers.

The thickness, d, of the dynode layer must be such that it is greater than $\overline{L}$, the average electron track length, and suitable thicknesses may range from 1 μm to 3000 μm, preferably from 200 μm to 600 μm. The thickness is adjusted by varying the rate and time of deposition, parameters which can be determined by routine experimentation. The apparent density of the performing substance may be calculated from the volume of the performing substance (thickness multiplied by area of performing substance) and the weight of the performing substance. As indicated previously, this apparent density should be in the range of 0.3 to 4 percent of the density of the performing substance when in the monocrystalline state. For example, monocrystalline cesium iodide has a density of 4.5 g/cm³. When deposited in accordance with the subject invention to form a dynode layer, the apparent density of the cesium iodide dynode layer should range from c.a. 0.013 to about 0.18 g/cm³. This layer is formed of crystals and crystallites optionally together with non-crystalline material. The term "crystallite" as used herein is inclusive of single crystals, multiple crystals, and combinations of the latter two along with amorphous material. The crystallites have random orientation (i.e. the major crystal axes are directed substantially randomly from crystal to crystal) and in random locations (i.e. the location of any given crystallite is non-predetermined, and will vary from MRCP to MRCP).

The fencing cylinder surrounding the boat containing the substance to be deposited serves to isolate the vaporized substance to the zone of deposition and to prevent substance from condensing on surfaces other than the desired surface, for example on the reverse side of the MRCP substrate. Other equivalent means of preventing such unwanted deposition will suggest themselves to those skilled in the art. The fencing cylinder surrounding the boat containing the substance to be deposited further serves to stabilize the vapor in a stable bubble shape form. Suitable fencing cylinders used in standard bell jars measuring 12 inches in diameter by 15 inches high are, for example, fencing cylinders measuring 140 mm in diameter and 70 mm or more in length, with the deposition source advantageously located 40 mm above the bottom of the bell jar.

The deposition of the dynode layer may begin as soon as a portion of the substance to be deposited enters the vapor phase, however under such conditions, optimal performing substances may not be created. It is preferable to delay deposition until the deposition substance has stabilized, i.e., is molten and the resistive evaporator or equivalent device supplies sufficient heat that neither melting nor fusion of the source takes place during performing substance formation. It is further preferable that no more than about 20 weight percent of the deposition source vaporizes during performing substance formation, i.e., a significant excess of deposition substance is preferably used. The purity of the deposition substance should preferably exceed 99.9%, and is more preferably of higher purity.

Investigation of the performing substance structure reveals that the density ratio of the performing substance (ρ) and the monocrystal substance ($\rho_o$) [$\rho/\rho_o$], is preferably from 0.003 to 0.02, more preferably 0.005 to 0.02, corresponding to a density, expressed as a percentage, of from about 0.3–0.5 to about 2 percent compared to the density of the substance prior to deposition. However, obtaining this ratio is not enough. The MRCP's multiplication will take place only if the average electron track length ($\overline{L}$), which in turn is defined by the average channel diameter between walls forming the channels, exceeds some definite size depending on the deposition substance.

The physical principles of MRCP EM are as follows. The actuating medium of the MRCP can be presented as a combination of chaotically situated dynodes of arbitrary size and location. A tiny crystal of the particular performing substance plays the role of the dynode. Then, electron multiplication can be presented as a cascade process, where in each stage of it Secondary Electron Emission (SEE) occurs. If the SEE coefficient of the dynode is σ and the energy of secondary electron is E, then $\sigma = AE^\alpha$, where A and α are emission property constants of the substance in monocrystal state. $E = V\overline{L}/d$, where V is voltage per plate, $\overline{L}$ is electron track average length, and d is thickness of plate. So, the overall gain G is given by:

$$G = \sigma^{d/\overline{L}} = (AE^\alpha)^{d/\overline{L}} = \left[ A\left(\frac{V\overline{L}}{d}\right)^\alpha \right]^{d/\overline{L}} = \left[ A\left(\frac{V}{\overline{\gamma}}\right)^\alpha \right]^{\overline{\gamma}}$$

where $\overline{\gamma}$- is a mean caliber of MRCP channel and $\overline{\gamma} \equiv d/\overline{L}$.

The analogy of equation above with the corresponding formula of a microchannel plate should be apparent to one with ordinary skill in the art. The proposed technology creates a fast acting, coordinate-sensitive EM similar to the MCP, but different from it by irregularly sized and situated channels. In turn, the MRCP, with simple technology, results in increased working surface at a significant decrease in cost.

Experimental results provide the basis for the following comparison of results presented in Table 1 between a micro channel plate device (MCP) and the micro random channel plate (MRCP) of the present invention. These enhanced performance characteristics make possible many new and exciting applications of MRCP technology.

TABLE 1

| DESCRIPTION | MCP | MRCP |
|---|---|---|
| Thickness | 300–2000 μ | 1–3000 μ |
| Diameter of channels | 10–100 μ | 1–20 μ |
| Clearance between channels | 2–10 μ | ~0 |
| Amount of channels | $10^6$ cm$^{-2}$ | $10^7$ cm$^{-2}$ |
| Caliber | 40–100 | 0–3000 |
| Channel angle | 0–15° | any |
| Surface | flat | any form |
| Maximum diameter | ~120 mm | practically unlimited |
| Surface metallization | Ni,Al,NiCr | any |
| Cross-section ratio areas | ~60% | ~100% |
| Multiplication coefficient | ~$10^4$ | ~$10^6$ |
| Working voltage | ~1000 V | ~1000 V |
| Electric field in channels | ~$10^4$V/cm | $\geq 10^4$V/cm |
| Resistance of channels | ~$10^{15}$ ohm | >$10^{15}$ ohm |
| Capacity | ~200 pF | ~50 pF |
| Pulse duration | ~1 ns | <1 ns |
| Rise time | <0,5 ns | <0,2 ns |
| Amplitude resolution | ~300% | $\leq$100% |
| Coordinate resolution | $10^{-3}$ cm | $10^{-3}$ cm |
| Signals fluctuation | ~100 ps | <100 ps |
| Dark noise | ~0,5 s$^{-1}$ cm$^{-2}$ | ~0,01 s$^{-1}$ cm$^{-2}$ |
| Coefficient of secondary emission at single event | ~2 | ~2 |
| Electron median energy at exit | ~70 eV | ~50 eV |
| DETECTION EFFICIENCY | | |
| Electrons >0,1 keV | ~50% | ~90% |
| Positive ions 1–1000 keV | 5–85% | ~100% |
| Soft x-rays 2–50 Å | ~10% | ~100% |
| Diagnostic x-rays 0,1–0,2 Å | ~10% | ~20–100% |
| Neutrons ~0,025 eV | — | ~10% |
| α- particles ~5 meV | — | ~100% |

EXAMPLE 1

A micro random channel plate electron multiplier device was prepared by forming a performing substance layer consisting of chaotically distributed dynodes of cesium iodide thus having random microchannels between the cesium iodide dynodes. The substrate consisted of a nickel grid having square holes measuring 100 by 100 μm in size, spaced 20 μm apart from each is other. The grid was 20 μm thick, and stretched onto an aluminum ring having a diameter of 30 mm.

Cesium iodide powder having a purity in excess of 99.9% and an average grain size of 0.3 mm in the amount of 1.0 gram was placed in the fold formed by creasing a 0.05 mm thick piece of molybdenum foil to form a deposition boat measuring 12 mm by 50 mm. The deposition boat containing cesium iodide was placed on a resistive heating stage located within a standard bell jar measuring 12 inches (30.5 cm) diameter by 15 inches (38.1 cm) high. The apparatus used is substantially that shown in FIG. 3. The jar was evacuated to $10^{-2}$ torr and the cesium iodide heated to 300° C., at which temperature it was maintained for a time period of approximately 10 minutes to ensure that the cesium iodide, which, like many salts is deliquescent, is thoroughly dry. The substrate is not heated. The heating stage and deposition boat is surrounded by a glass tube measuring 140 mm diameter by 70 mm length, and closed at its topmost end by a removable screen or shutter. Following drying of the cesium iodide, the pressure inside the jar was increased to 4 torr by admitting a stream of dry nitrogen, and the temperature of the deposition boat was increased to the point where the cesium iodide became molten. Following a two minute stabilization period, the shutter at the top of the tube was rotated away and the micro random channel plate substrate rotated into position. The distance between boat and substrate was 60 mm. The substrate was rotated at a rate of approximately 20 min$^{-1}$ and deposition proceeded for 10 minutes during which 10 mg of cesium iodide was deposited as random crystallites forming a performing substance layer having a thickness of 500 μm. The micro random channel plate device was then rotated away, the shutter repositioned over the top of the tube, and the apparatus allowed to return to ambient conditions of temperature and pressure.

The electrical characteristics of the MRCP thus prepared were measured, with the following results:

| Gain | $10^5$–$10^6$ |
|---|---|
| Time Resolution | ~$10^{-10}$ sec |
| Coordinate Resolution | ~$10^{-3}$ mm |
| Dark Noise | ~0.1 sec$^{-1}$ cm$^{-2}$ |
| Operation Voltage | ~800 volts |
| Operation Vacuum | $\leq 10^{-2}$ torr |

As can be seen from the example, the MRCP may be economically fabricated and has superior properties relative to conventional MCPS.

Figure 4:
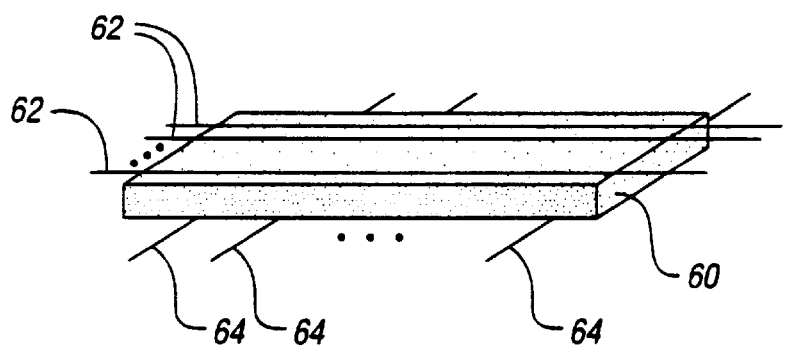
FIG. 4 presents a schematic diagram of an electron multiplier of one embodiment of the present invention.

Turning now to FIG. 4, an alternative embodiment of the electron multiplier of the present invention is presented. The MRCP is inherently coordinate sensitive. One with ordinary skill in the art will recognize that there are many methods for utilizing this coordinate sensitivity. One such configuration is shown. Micro random channel plate 60 is suspended above Y axis electrodes 64 and below X axis electrodes 62. Providing an electrical potential between any one X axis electrode 62 and any one Y axis electrode 64 provides an indication of instant electrons at the point of intersection between these selected electrodes. By this means, a matrix of electron intensities can be determined by successively applying an electric potential to each possible X axis/Y axis intersection. Thus, for instance, a 1024×1024 sensor could be developed for sophisticated imaging applications.

Figure 5:
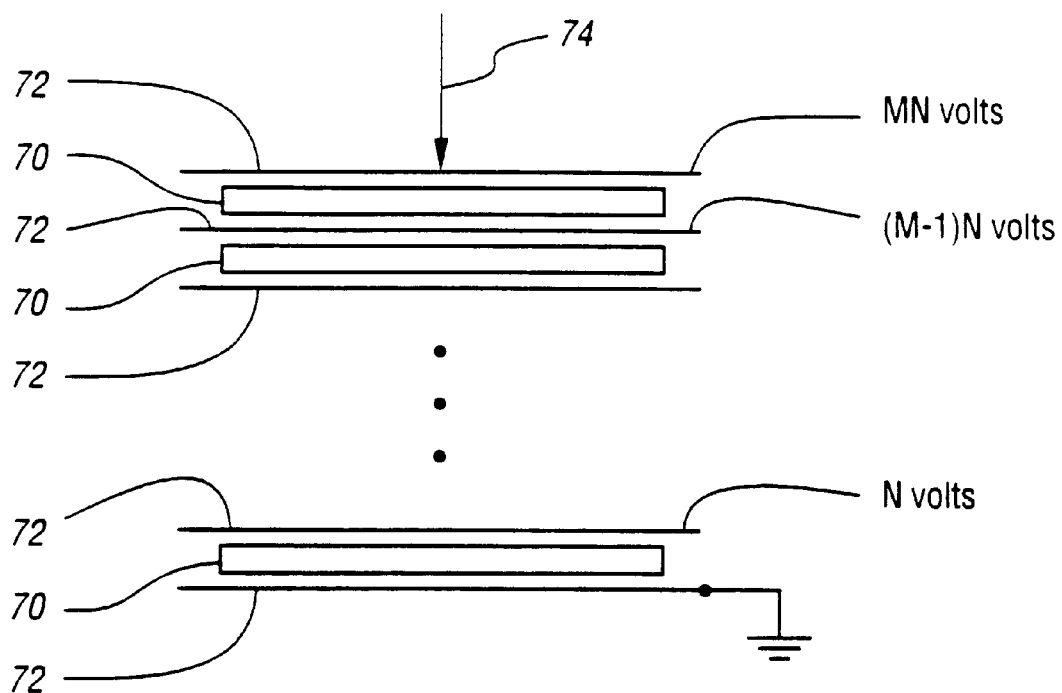
FIG. 5 presents a schematic diagram of an exemplary embodiment of an electron multiplier of the present invention.

Turning now to FIG. 5 an alternative configuration of an electron multiplier of the present invention is presented. A plurality of micro random channel plates 70 are provided as well as a plurality of electrodes 72. The top electrode is given an electric potential of MN volts, this second electrode 72 is given an electric potential of (M−1) N volts, etc., the next to last electrode is given a potential of N volts and the last electrode 72 is given a potential of 0 volts or some other reference voltage. An incident electron 74 to top plate 70 creates a series of secondary emissions which are in turn incident to the second plate. These incident electrons to the secondary plate in turn create secondary emissions which are incident to the third plate, etc. and subsequent plates, repeatedly forming a powerful and high gain electron multiplication device. One with ordinary skill in the art will recognize that this is but one of many possible configurations.

Figure 6:
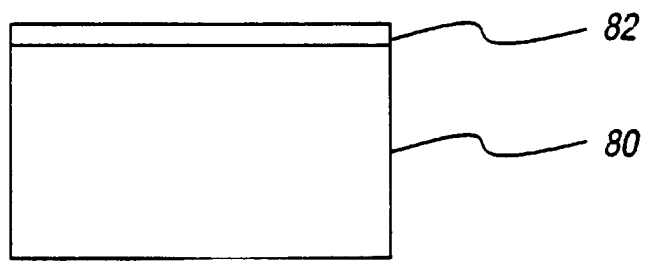
FIG. 6 presents a schematic diagram of an exemplary embodiment of an electron multiplier of the present invention.

Turning now to FIG. 6, an alternative embodiment of the electron multiplier of the present invention is presented. The performance of existing electron multipliers can be significantly enhanced by the use of an MRCP layer in conjunction with existing electron multiplier configurations. In this particular design, a layer of the micro random channel plate is deposited upon an existing micro channel plate device. The presence of the MRCP layer serves to increase the gain of the existing micro channel plate. Further, one with ordinary skill in the art will recognize that other existing electron multiplier devices could be modified by coating the plates, dynodes or electrodes with the random channel performing substance used in the micro random channel plate electron multiplier device. One additional such application would be the coating of the dynodes in a photo electron multiplier with the micro random channel plate layer to provide a much higher gain for the device allowing the device to be fabricated in a much smaller configuration.

The MRCP devices of the present invention may find application in many production applications. Examples of such applications include:

1. Dosimeters of radioactive pollution of air, water, soil, food or other substances—the advantages of MRCPs for this application include simplicity of production; small electric power consumption; inexpensiveness; and universal sensing of neutrons, alpha, beta, and gamma particles. Sizes of detectors can vary from large stationary detectors to microminiature detectors implanted in the case of electron wristwatch. Watch mounted detectors may signal increased radioactivity or accumulated doses of radiation for a given time interval.

2. Multiple use films for x-ray machines for custom service or for medical diagnosis—the high sensitivity of MRCPs permits the reduction of dosage levels by a factor of 100 times or more. Detector sizes may vary from very big for whole body imaging for large subjects to as small as one toothroot for small subject images. Similar technology can be used in detecting defects of crystals used in microschemes (chips), and transistor structures.

3. Microminiature detectors can be easily put in the human body for monitoring radioactive substances used for diagnostic purposes. Such detectors may be read through fiber optic cables or through electric signals.

4. The quality of pictures produced by planar, black, and white, or color video screens is significantly better than of conventional electron-ray tubes. The thickness of such screens may be 10 mm or smaller, with an energy consumption of no more than 1 w. Further, these designs would produce lower levels of radiation due to the increased sensitivity of MRCPs. Such video screens can be used in television sets with high clarity and sharpness, in oscilloscope or computer displays etc. The useful area of such screens could easily range from 2–3 cm to 100×100 cm and beyond.

5. Coordinate sensitive super fast acting detectors are useful in any sphere of science and technology where is a need for registration of X and gamma rays, charged elemental particles practically of any kind and energy, nuclear fission, thermal neutrons, etc. These detectors can be used in nuclear physics and chemistry, in nuclear power plants, and in space research etc. They can replace high cost semiconductor detectors, microchannel plates, photo-electron multipliers, or electron-optic transformers, with most characteristics of the above mentioned devices improved.

6. Vacuum ultraviolet ray registration is also possible with MRCP technology. Space mounted sensors could measure U.V. rays in the upper atmosphere. Personal U.V. sensors could be produced for measuring the total U.V. dosage for health reasons or even for proper tanning.

A possible application of the random channel plate fabricating methods of the present invention would be in the field of microfine filters.

All-in-all, one of ordinary skill in the art will recognize a wide array of possible applications.

While the best mode for carrying out the invention has been described in detail, those familiar with the art to which this invention relates will recognize various alternative designs and embodiments for practicing the invention as defined by the following claims.

What is claimed is:

1. A micro random channel plate device suitable for use in an electron multiplier, comprising:

a substrate having on at least one surface thereof a performing substance layer of 10 $\mu$m to 3000 $\mu$m thickness comprising a plurality of randomly situated randomly orientated crystallite dynodes having interspersed therebetween a plurality of random microchannels, said microchannels composed of open space, the average electron track length $\overline{L}$ of said microchannels being greater than 2 $\mu$m and less than said thickness of said performing substance layer, said microchannel plate device having a gain in excess of $10^4$, and a dark current less than 0.2 sec$^{-1}$ cm$^{-2}$, wherein said performing substance layer has a density of from 0.3% to about 4% of the density of the performing substance when in a monocrystalline state.

2. The micro random channel plate device of claim 1 wherein the dark current of said micro random channel plate device is less than 0.2 sec$^{-1}$ cm$^{-2}$ and the gain of said device is greater than $10^4$ at an operating pressure of $10^{-2}$ torr.

3. The micro random channel plate device of claim 1, wherein said substrate comprises a microchannel plate device.

4. A micro random channel plate device, comprising:
a) a substrate;
b) a performing substance layer on said substrate, said performing substance layer comprising a plurality of randomly situated dynodes interspersed with open space constituting random microchannels;
wherein said performing substance layer generates secondary electron emission in the presence of an electric field in response to an incident electron.

5. The micro random channel plate device of claim 4 wherein said performing substance layer is a deposited substance wherein the apparent density of said performing substance layer is from 0.3% to 4% of the density of the substance deposited when said substance is in the monocrystalline state.

6. The micro random channel plate device of claim 4 wherein the apparent density of said performing substance layer is from 0.5% to 2% of the density of the substance when in the monocrystalline state.

7. The micro random channel plate device of claim 4 wherein said dynode layer has a thickness of from 1 $\mu$m to 3000 $\mu$m.

8. The micro random channel plate device of claim 4 wherein the dark current of said micro random channel plate device is less than 0.2 sec$^{-1}$ cm$^{-2}$ and the gain of said device is greater than $10^4$ at an operating pressure of $10^{-2}$ torr.

9. The micro random channel plate device of claim 4 wherein said dynodes comprise crystals of said deposition substance.

10. The micro random channel plate device of claim 4 wherein said dynodes comprise crystallites of said deposition substance.

11. The micro random channel plate of claim 1 wherein said substrate is a microchannel plate device.

12. The micro random channel plate device of claim 1, wherein said performing substance layer consists of a Group Ia metal halide.

13. The micro random channel plate device of claim 4, wherein said performing substance layer consists of a Group Ia metal halide.

14. The micro random channel plate device of claim 5 wherein said performing substance layer consists of a Group Ia metal halide.

15. The micro random channel plate device of claim 4 wherein said performing substance is selected from the group consisting of alkali metal halides, alkali metal oxides, alkali metal sulfides, alkaline earth metal halides, alkaline earth metal oxides, alkaline earth metal sulfides, Group IIIa metal halides, Group IIIa metal oxides, Group IIIa metal sulfides, and mixtures thereof.

* * * * *